US011450787B2

(12) United States Patent
Wang et al.

(10) Patent No.: US 11,450,787 B2
(45) Date of Patent: Sep. 20, 2022

(54) LIGHT-EMITTING DEVICE

(71) Applicant: EPISTAR CORPORATION, Hsinchu (TW)

(72) Inventors: Chung-Hao Wang, Hsinchu (TW); Yu-Chi Wang, Hsinchu (TW); Yi-Ming Chen, Hsinchu (TW); Yi-Yang Chiu, Hsinchu (TW); Chun-Yu Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 129 days.

(21) Appl. No.: 16/987,994

(22) Filed: Aug. 7, 2020

(65) Prior Publication Data

US 2021/0043803 A1 Feb. 11, 2021

(30) Foreign Application Priority Data

Aug. 8, 2019 (TW) .................................. 108128167

(51) Int. Cl.
*H01L 33/20* (2010.01)
*H01L 33/46* (2010.01)
*H01L 33/38* (2010.01)
*H01L 33/22* (2010.01)
*H01L 33/00* (2010.01)

(52) U.S. Cl.
CPC .............. *H01L 33/20* (2013.01); *H01L 33/22* (2013.01); *H01L 33/387* (2013.01); *H01L 33/46* (2013.01); *H01L 33/0093* (2020.05)

(58) Field of Classification Search
CPC ....... H01L 33/20; H01L 33/22; H01L 33/387; H01L 33/46
See application file for complete search history.

(56) References Cited

U.S. PATENT DOCUMENTS

| | | | | |
|---|---|---|---|---|
| 10,002,991 | B2 * | 6/2018 | Liao | H01L 33/22 |
| 10,205,059 | B2 * | 2/2019 | Lin | H01L 33/44 |
| 2013/0037839 | A1 * | 2/2013 | Kazama | H01L 33/38 |
| | | | | 257/E33.065 |
| 2016/0211412 | A1 * | 7/2016 | Chiu | H01L 33/505 |
| 2017/0040492 | A1 * | 2/2017 | Chiu | H01L 33/10 |
| 2018/0301598 | A1 * | 10/2018 | Baur | H01L 33/44 |

* cited by examiner

*Primary Examiner* — Mark W Tornow
(74) *Attorney, Agent, or Firm* — Muncy, Geissler, Olds & Lowe, P.C.

(57) ABSTRACT

An optoelectronic semiconductor device includes a semiconductor stack, an electrode, and a plurality of contact portions. The semiconductor stack includes a first type semiconductor structure, an active structure on the first type semiconductor structure, and a second type semiconductor structure on the active structure. The first type semiconductor structure includes a first protrusion part, a second protrusion part and a platform part between the first protrusion part and the second protrusion part. The semiconductor stack includes a thickness. The electrode on the second type semiconductor structure includes a region corresponding to the first protrusion. The contact portions are located at the second protrusion part without being at the first protrusion part. The contact portions are attached to the first type semiconductor structure. There is a first distance between the electrode and the nearest contact portion, and a ratio of the first distance to the thickness of the semiconductor stack is larger than 5.

20 Claims, 9 Drawing Sheets

|  | comparison sample | experimental sample 1 | experimental sample 2 | experimental sample 3 |
|---|---|---|---|---|
| radiant flux( ) | 287.26 | 303.71 | 296.2 | 291.66 |
| radiant flux enhancement ratio | --- | 5.7% | 3.1% | 1.53% |

LIGHT-EMITTING DEVICE

TECHNICAL FIELD

The disclosure relates to a semiconductor device, and particularly to an optoelectronic semiconductor device.

CROSS REFERENCE TO RELATED APPLICATION

This application claims the right of priority based on TW Application Serial No. 108128167, filed on Aug. 8, 2019, and the content of which is hereby incorporated by reference in its entirety.

DESCRIPTION OF BACKGROUND ART

Semiconductor devices include semiconductive compounds including III-V group elements, such as GaP, GaAs, or GaN. Semiconductor devices can be power devices or optoelectronic devices, such as a light-emitting device (LED), LASER, photodetector, or solar cell. LEDs include a p-type semiconductor layer, an n-type semiconductor layer, and an active structure located between the p-type semiconductor layer and the n-type semiconductor layer. Under an external electrical power supply, the n-type semiconductor layer and p-type semiconductor layer provide electrons and holes respectively for the recombination in the active structure and further convert electrical energy into light.

SUMMARY OF THE DISCLOSURE

The present disclosure provides an optoelectronic semiconductor device. The optoelectronic semiconductor device includes a semiconductor stack, an electrode, and a plurality of contact portions. The semiconductor stack includes a first type semiconductor structure, an active structure located on the first semiconductor structure and a second type semiconductor structure located on the active structure. The first type semiconductor structure has a first protrusion part, a second protrusion part, a platform part located between the first protrusion part and the second protrusion part, and the semiconductor stack has a thickness. The electrode, having a region corresponding to the first protrusion part, is located on the second type semiconductor structure. The contact portions contact the first semiconductor structure and are located at the second protrusion part and not at the first protrusion part. The electrode has a first distance to the nearest contact portion, and the ratio of the first distance to the thickness of the semiconductor stack is larger than 5.

BRIEF DESCRIPTION OF THE DRAWINGS

The foregoing aspects and many of the attendant advantages of the present disclosure will become more readily appreciated as the same becomes better understood by reference to the following detailed description, when taken in conjunction with the accompanying drawings, wherein:

FIG. 3 to FIG. 4A are bottom view diagrams of the structure of an optoelectronic semiconductor device respectively corresponding to two steps of manufacture procedure disclosed in one embodiment in accordance with the present disclosure;

FIG. 4B shows an enlarged view of region A in FIG. 4A;

DETAILED DESCRIPTION OF PREFERRED EMBODIMENTS

Figure 1:
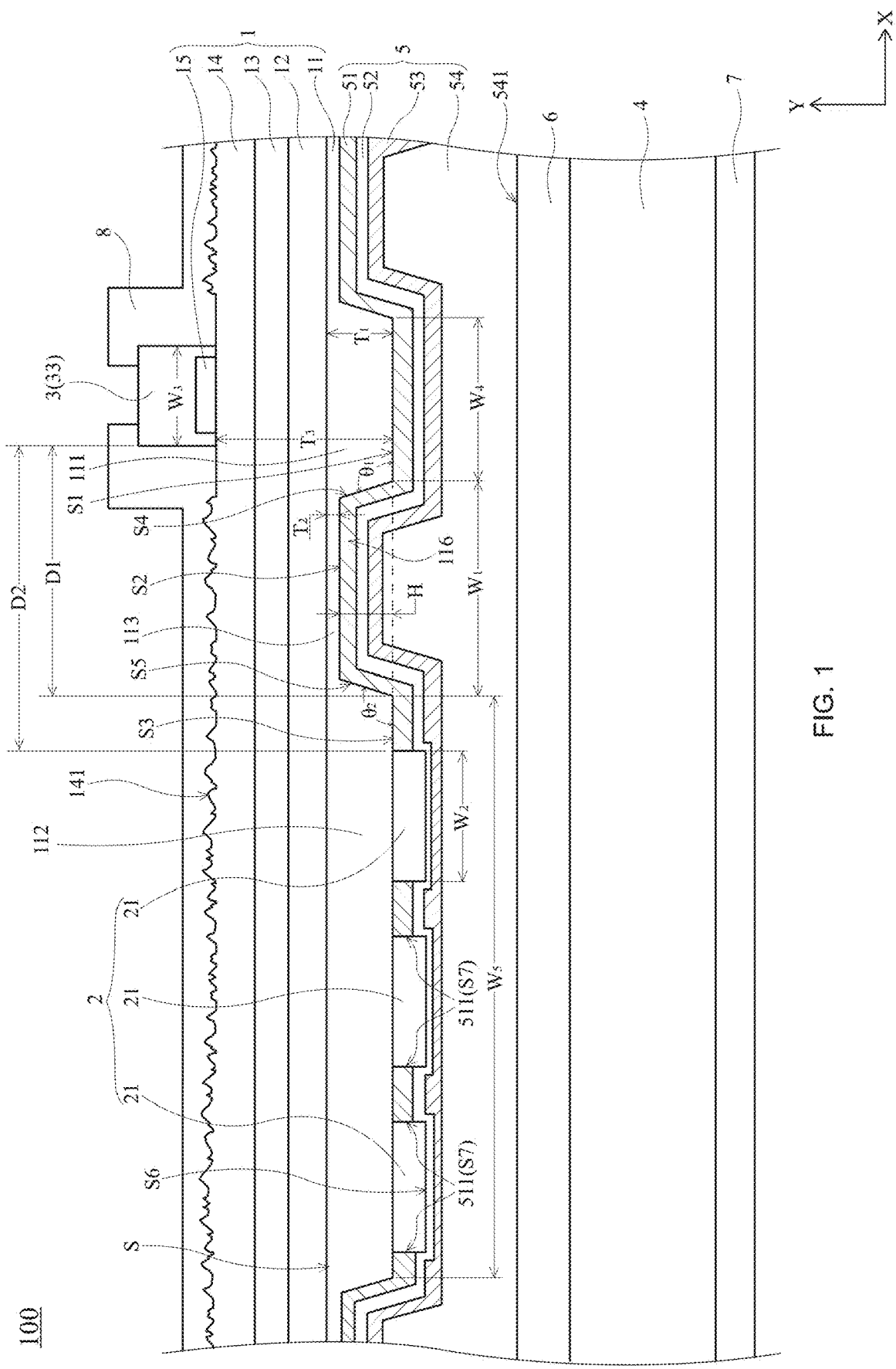
FIG. 1 shows a cross-sectional view of the diagram of an optoelectronic semiconductor device disclosed in one embodiment in accordance with the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized in various forms. Further, the drawings are not precise scale and components may be exaggerated in view of width, height, length, etc. Herein, the similar or identical reference numerals will denote the similar or identical components throughout the drawings.

Figure 2:
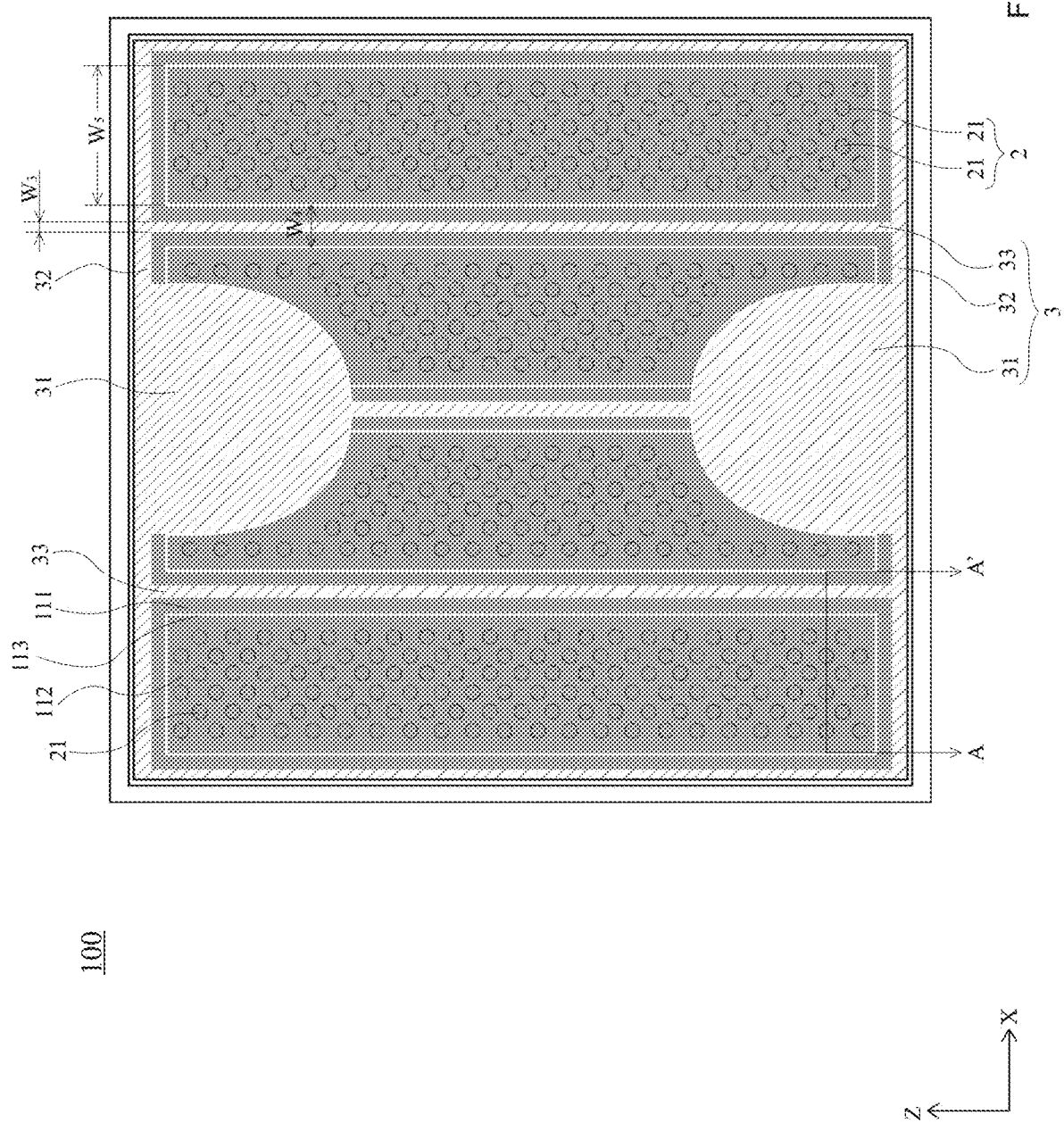
FIG. 2 is a top view of an optoelectronic semiconductor device disclosed in one embodiment in accordance with the present disclosure.

FIG. 1 shows a cross-sectional view of the diagram of an optoelectronic semiconductor device 100 disclosed in one embodiment in accordance with the present disclosure. FIG. 2 is a top view of an optoelectronic semiconductor device disclosed in one embodiment in accordance with the present disclosure. The cross-sectional view of the structure along the A-A' line in FIG. 2 is shown as the cross-section diagram of the optoelectronic semiconductor device 100 shown in FIG. 1. As shown in FIG. 1 and FIG. 2, the optoelectronic semiconductor device 100 includes a semiconductor stack 1, a first contact structure 2 located beneath the semiconductor stack 1, and an upper electrode 3 located on the semiconductor stack 1. Referring to FIG. 2 the upper electrode 3 includes an electrode pad 31, a first extension electrode 32, and a second extension electrode 33. In FIG. 1, the diagram only depicts the second extension electrode 33. A substrate 4 and a reflective structure 5 can be optionally located on the optoelectronic semiconductor device 100. The reflective structure 5 is located between the substrate 4 and the semiconductor stack 1, which can increase the light-emitting efficiency by reflecting the light generated from the semiconductor stack 1 to the second extension electrode 33.

The semiconductor stack 1 can be a p-n structure or a p-i-n structure. In one embodiment, the semiconductor stack 1 includes a first type semiconductor structure 11, an active structure 12 located on the first type semiconductor structure 11, and a second type semiconductor structure 13 located on the active structure 12. In other words, the active structure 12 and the second type semiconductor structure 13 are located on the first type semiconductor structure 11 along a stacking direction, which is the Y-axis perpendicular to the X-axis in the figure. In one embodiment, the optoelectronic semiconductor device 100 is a light-emitting device, the semiconductor stack 1 is a light-emitting stack, the first type semiconductor structure 11 and the second type semiconductor structure 13 can be cladding layers and/or confinement layers having a bandgap larger than that of the active structure 12 in order to increase the combination possibility of electrons and holes in the active structure 12. With different materials, the active structure 12 can emit a light with peak wavelength in the range of 200~1800 nm, e.g., 700 nm~1700 nm infrared light, 610 nm~700 nm red light, 530 nm~570 nm yellow light, 490 nm~550 nm green light, 400 nm~490 nm blue or deep blue light, or 250 nm~400 nm ultraviolet light. In this embodiment, the peak wavelength of the active structure 12 is a red light in the range between 610 nm and 700 nm.

The first type semiconductor structure 11 and the second type semiconductor structure 13 can be a single-layer or multi-layer structure with either a first conducting type or an oppositely charged second conducting type, which provide either electrons or holes respectively. In one embodiment, the first type semiconductor structure 11 and the second type semiconductor structure 13 can optionally include a distributed Bragg reflector (DBR). The semiconductor stack 1 can include a single heterostructure or double heterostructure. The active structure 12 can include multiple quantum wells. The first type semiconductor structure 11, the second type semiconductor structure 13 and the active structure 12 include III-IV compound semiconductor, such as GaAs, InGaAs, AlGaAs, AlInGaAs, GaP, InGaP, AlInP, AlGaInP, GaN, InGaN, AlGaN, AlInGaN, AlAsSb, InGaAsP, InGaAsN, AlGaAsP. In embodiments of the present disclosure, if not described otherwise, the above-mentioned chemical formulas include "stoichiometric compounds" and "non-stoichiometric compounds". A "stoichiometric compound" is, for example, a compound in which the total number of atoms of III-group elements is the same as the total number of atoms of V-group elements. On the contrary, a "non-stoichiometric compound" is, for example, a compound in which the total number of atoms of III-group elements is different from the total number of atoms of V-group elements. For example, a compound has a chemical formula of AlGaAs represents that the compound includes Al and Ga as III-group elements, and As as V-group element, wherein the total number of atoms of the III-group elements (Al and/or Ga) and the total number of atoms of the V-group elements (As) may be the same or different. In addition, if the above-mentioned compounds represented by the chemical formulas are stoichiometric compounds, then AlGaAs represents for $Al_{x1}Ga_{(1-x1)}As$, wherein $0<x1<1$; AlInP represents for $Al_{x2}In_{(1-x2)}P$, wherein $0<x2<1$; AlGaInP represents for $(Al_{y1}Ga_{(1-y1)})_{1-x3}In_{x3}P$, wherein $0<x3<1$, and $0<y1<1$; AlGaN represents for $Al_{x4}Ga_{(1-x4)}N$, wherein $0<x4<1$; AlAsSb represents for $AlAs_{x5}Sb_{(1-x5)}$, wherein $0<x5<1$; InGaP represents for $In_{x6}Ga_{1-x6}P$, wherein $0<x6<1$; InGaAsP represents for $In_{x7}Ga_{1-x7}As_{(1-y2)}Py_2$, wherein $0<x7<1$, and $0<y2<1$; InGaAsN represents for $In_{x8}Ga_{1-x8}As_{1-y3}N_{y3}$, wherein $0<x8<1$, and $0<y3<1$; AlGaAsP represents for $Al_{x9}Ga_{1-x9}As_{1-y4}Py_4$, wherein $0<x9<1$, and $0<y4<1$; InGaAs represents for $In_{x10}Ga_{1-x10}As$, wherein $0<x10<1$.

As FIG. 1 shows, a recess 116 is formed in the first type semiconductor structure 11 and the first type semiconductor structure 11 includes a first protrusion part 111, a second protrusion part 112, and a platform part 113. The first protrusion part 111 has a first thickness T1 and the platform part 113 has a second thickness T2 that is less than the first thickness T1. In this embodiment, the second protrusion part 112 has a thickness that is substantially equal to the thickness of the first protrusion part 111. The first thickness T1 is the distance between the bottom surface S of the active structure 12 and the first base surface S1 of the first protrusion part 111 along the Y-axis direction in the figure. In other words, the first thickness T1 is perpendicular to the bottom surface S and the first base surface S1. The second thickness T2 is the distance between the bottom surface S and a second base surface S2 of the platform part 113 long the Y-axis direction in the figure. In other words, the second thickness T2 is perpendicular to the bottom surface S and a second base surface S2. The first base surface S1 and the second base surface S2 are both away from the second type semiconductor structure 13. When the active structure 12 has multiple layers, the aforementioned bottom surface S is the surface nearest to the first type semiconductor structure 11. In this embodiment, the first thickness T1 is in a range of 0.5 μm~2 μm and the second thickness T2 is in a range of 0.01 μm~1 μm. The ratio of the first thickness T1 to second thickness T2 can be in a range of 0.5~200, such as 1, 2, 10, 20, or 100. The semiconductor stack 1 has a third thickness T3 that can be measured from the first base surface S1 to the second extension electrode 33. In this embodiment, the third thickness T3 is in the range of 4.5 μm~6.5 μm.

The second protrusion part 112 has a third base surface S3 away from the second type semiconductor structure 13. The first protrusion part 111 has a first side surface S4 connecting to the first base surface S1 and the second base surface S2; the second protrusion part 112 has a second side surface S5 connecting to the second base surface S2 and the third base surface S3. The first side surface S4, the second side surface S5, and the second base surface S2 together define the recess 116, and the first side surface S4 faces the second side surface S5. The first side surface S4 is not perpendicular to the first base surface S1 and the second side surface S5 is not perpendicular to the third base surface S3. Particularly, there is a first angle θ1 between the first side surface S4 and the first base surface S1 ranging from 100° to 165°. There is a second angle θ2 between the second side surface S5 and the third base surface S3 ranging from 100° to 165°. The reflective structure 5 is located beneath the first protrusion part 111, the second protrusion part 112, and the platform part 113 of the first type semiconductor structure 11. In a different aspect, the first base surface S1, the second base surface S2, the third base surface S3, the first side surface S4, and the second side surface S5 are attached to the reflective structure 5. Therefore, the light emitted from the active structure 12 to the reflective structure 5 can be reflected by the reflective structure 5 and further be retracted from the optoelectronic semiconductor device 100 in the direction toward the second extension electrode 33. More specifically, the light can be oriented to a light-emitting surface 141 at different angles by the first side surface S4, the second side surface S5 and the first base surface S1, second base surface S2, third base surface S3 when it is emitted from the active structure 12 toward the reflective structure 5. Thus, the light extraction efficiency of the optoelectronic semiconductor device 100 is increased by reducing the possibility of total reflection on the light-emitting surface 141, which means the light can be retracted from the optoelectronic semiconductor device 100 with less resistance.

The first side surface S4 or/and the second side surface S5 is/are not perpendicular to the second base surface S2, thus the recess 116 has a gradient width, for example, in this embodiment, the width of the recess 116 gradually increases along the direction away from the second type semiconductor structure 13. In another embodiment, the width of the recess 116 gradually decreases along the direction away from the second type semiconductor structure 13. The maximum of the gradient width of the recess 116 is labeled as the first width W1. Besides, the recess 116 has a height H (H=T1−T2). In this embodiment, the height H is 0.5 μm 1.5 μm, thus the light can be reflected on the specific area of the first side surface S4 and the second side surface S5. The first width W1 and the height H have a ratio W1/H greater than 3 and less than 8, such as 3, 3.5, 4, 5, 6, and 7.

As shown in FIG. 1, the semiconductor stack 1 can optionally include a window layer 14 located on the second type semiconductor structure 13. The window layer 14 is transparent for the light generated from the active structure 12, for example, the bandgap of the window layer 14 is greater than that of the active structure 12. Besides, the window layer 14 can enhance the light extraction efficiency of the optoelectronic semiconductor device 100 and/or the uniformity of the current spreading. The thickness of the window layer 14 is greater than 1500 nm and less than 4000 nm, such as 1500 nm, 2000 nm, 2500 nm, 3000 nm, 3500 nm, and 4000 nm. In one embodiment, the window layer 14 has a doping concentration greater than $1\times10^{17}/cm^3$ and less than $1\times10^{19}/cm^3$, such as $1\times10^{17}/cm^3$, $5\times10^{17}/cm^3$, $1\times10^{18}/cm^3$, or $5\times10^{18}/cm^3$. The window layer 14 has a light-emitting surface 141 for the light generated from the active structure 12 to be retracted form the light-emitting surface 141 of the optoelectronic semiconductor device 100. The light-emitting surface 141 can be a roughened surface, which reduces the possibility of total reflection happened on the light-emitting surface 141 and scatters the light emitted from the semiconductor stack 1, to enhance the light efficiency of the semiconductor stack 1.

The semiconductor stack 1 optionally includes a second contact structure 15 on the window layer 14. To be more specific, the second contact structure 15 is located on a part of the light-emitting surface 141 and is located between the window layer 14 and the second extension electrode 33. In this embodiment, there is a low resistance between the second contact structure 15 and the window layer 14, which means the resistance between the second contact structure 15 and the window layer 14 is less than the resistance between the second extension electrode 33 and the window layer 14. In this embodiment, the second extension electrode 33 is located on the second contact structure 15, and in cross-sectional view, the second extension electrode 33 has a third width W3 greater than the width of the second contact structure 15. The window layer 14 and the second contact structure 15 includes III-V compound semiconductor, such as GaAs, InGaAs, AlGaAs, AlInGaAs, GaP, InGaP, AlInP, AlGaInP, GaN, InGaN, AlGaN, AlInGaN, AlAsSb, InGaAsP, InGaAsN, or AlGaAsP.

The first contact structure 2 is located beneath the first type semiconductor structure 11 and has a plurality of contact portions 21, which is separate from each other. The contact portions 21 are located at the second protrusion part 112. In this embodiment, there is no contact portions 21 beneath the first protrusion part 111 and the platform part 113 (i.e., the contact portions 21 are only located at the second protrusion part 112 region). Therefore, most current can be driven from the contact portions 21 beneath the second protrusion part 112 toward the reflective structure 5. More specifically, the first contact structure 2 and the third base surface S3 of the second protrusion part 112 are electrically connected. The first contact structure 2 can include metal, alloy, or semiconductor. The metal can be selected from the group including Au, Ag, Ge, or Be, etc. The alloy includes the combination of the above metal elements. The semiconductor includes III-V compound semiconductor, such as GaAs, AlGaAs, or GaP.

When the first contact structure 2 includes III-V compound semiconductor, the first contact structure 2 can be either n-type doped or p-type doped, and the doping concentration can be in the range from $1\times10^{18}/cm^3$ to $1\times10^{20}/cm^3$. In another embodiment, the doping concentration in the contact portions 21 increases along the direction away from the first type semiconductor structure 11. In this embodiment, viewing from the cross-section view of the optoelectronic semiconductor device 100, the contact portion 21 has a second width W2 and the third base surface S3 has a fifth width W5. When the first contact structure 2 is semiconductor, the second width W2 can be in the range from 5% to 50% of the fifth width W5. In another embodiment, while the first contact structure 2 is metal or alloy, the second width W2 can be in the range from 1% to 20% of the fifth width W5. Besides, the contact portions 21 can have the same shape and/or dimension to each other, such as circle, triangle, or irregular shape. In other embodiments, the contact portions 21 can have different shapes and/or dimensions. It should be noted that the present disclosure is not limited to the embodiments herein and can be realized in various forms.

Referring to FIG. 1 and FIG. 2, a part of the upper electrode 3 (i.e., second extension electrode 33) corresponds to the first protrusion part 111. Particularly, a part of the upper electrode 3 (i.e., second extension electrode 33) and the first protrusion part 111 are overlapped in the vertical direction, i.e., the Y-axis direction. In this embodiment, the projection of the second extension electrode 33 toward the first protrusion part 111 is fully in the scope of the first protrusion part 111 so the first side surface S4 and the second extension electrode 33 are not overlapped in the vertical direction. The second extension electrode 33 has the third width W3, which is smaller than a fourth width W4 of the first base surface S1 of the first protrusion part 111, while the third base surface S3 of the second protrusion part 112 has the fifth width W5 greater than the fourth width W4. As indicated in FIG. 1, the distance between the second extension electrode 33 and the second protrusion part 112 along the direction parallel to the X-axis direction is defined as the first distance D1. The distance between the second extension electrode 33 and the contact portion 21 nearest to the second extension electrode 33 along the direction parallel to the X-axis direction is defined as the second distance D2, which is greater than the first distance D1. The second distance D2 is greater than 3 μm and less than 20 μm, such as 5 μm, 8 μm, 10 μm, 12 μm, or 15 μm, which enables the current from the second extension electrode 33 to transfer farther and reduces the possibility of the light emitted from the active structure 12 being blocked by the second extension electrode 33 after being reflected. In one embodiment, the difference between the second distance D2 and the first distance D1 (D2−D1) is less than 20 μm and greater than 2 μm, such as 15 μm, 10 μm, 8 um, 5 μm, 3 μm. In this way, the light extraction efficiency can be enhanced by the light effectively retracted from the light-emitting surface 141 after reflected by the second side surface S5. In one embodiment, when the second distance D2 and the difference D2−D1 fit the aforementioned conditions, the optoelectronic semiconductor device 100 has the above-mentioned benefits.

In one embodiment, the second distance D2 is greater than the third thickness T3 of the semiconductor stack 1, and its ratio D2/T3 is greater than 5 and less than 20, such as 5, 6, 7, 8, 9, 10, 12, 14, 16, 18, or 20 to avoid the second extension electrode 33 from blocking the light emitted from the active structure 12 that may reduce the light-emitting efficiency. Similarly, when the ratio D2/T3 and the difference of D2−D1 fit the above-mentioned conditions the optoelectronic semiconductor device 100 has the above-mentioned benefits. In another aspect, the distance from the intersection point of the third base surface S3 and the second side surface S5 to the edge of the second extension electrode 33 along a direction parallel to the X-axis direction is the first distance D1. The distance from the edge of the second extension electrode 33 to the edge of the nearest contact portion 21 along a direction parallel to the X-axis direction is the second distance D2.

FIG. 2 shows a top-view diagram of the optoelectronic semiconductor device 100 disclosed in one embodiment in accordance with the present disclosure, and the dotted lines represent the structures that cannot be observed directly from the top view, which means the component surrounded in the dotted line is covered by some other components. The upper electrode 3 of the optoelectronic semiconductor device 100 includes one electrode pad 31, a plurality of the first extension electrodes 32, and a plurality of the second extension electrodes 33. Moreover, the projections of the first contact structures 2 are not overlapped with the electrode pad 31, the first extension electrodes 32, and the second extension electrodes 33 in the Y-axis direction. In this embodiment, the first extension electrodes 32 connect to the electrode pad 31, the second extension electrodes 33 connect to the first extension electrodes 32, and the width of the first extension electrodes 32 is greater than that of the second extension electrodes 33 to improve the current spreading in the optoelectronic semiconductor device 100. In this embodiment, the first extension electrodes 32 are perpendicular to the second extension electrodes 33, but the configuration of the upper electrode 3 on the optoelectronic semiconductor device 100 is not limited to the embodiments herein.

Referring to FIG. 1 and FIG. 2, the third width W3 in FIG. 1 refers to the width of the second extension electrodes 33, which is an example of one embodiment in accordance with the present disclosure. In another embodiment, the upper electrode 3 in FIG. 1 can be an electrode pad 31, which does not include any extension electrode. Therefore, the third width W3 of the upper electrode 3 can be the width of the electrode pad 31.

The substrate 4 can support the semiconductor stack 1 and other layers or structures thereon. The semiconductor stack 1 can be grown on the substrate 4 or other growth substrates (not shown) through metal-organic chemical vapor deposition (MOCVD), molecular beam epitaxy (MBE) or hydride vapor phase epitaxy (HVPE). In the situation that the semiconductor stack 1 is grown on the growth substrate, the growth substrate can be optionally removed and the semiconductor stack 1 can be further bonded on the substrate 4 by substrate transfer technique. In one embodiment, the semiconductor stack 1 can be firstly formed on the growth substrate and then be attached to the substrate 4 by conductive bonding layer 6 through the substrate transfer technique. More specifically, the substrate 4 can be transparent, translucent or opaque for the light emitted from the active structure 12, and the substrate 4 can be conductive, semiconductive or insulative. In this embodiment, the optoelectronic semiconductor device 100 can be vertical-type and the substrate 4 can be conductive materials, including metals, alloys, metal oxides, semiconductors or carbonaceous materials. The metals can include but not limited to Cu, Al, Cr, Sn, Au, Ni, Ti, Pt, Pb, Zn, Cd, Sb, Mo, W, or Co. The alloys can include any of the metal which is mentioned above. The metal oxides include ITO, InO, SnO, CTO, ATO, AZO, ZTO, GZO, IWO, ZnO, IZO, $Ga_2O_3$, $LiGaO_2$, $LiAlO_2$, or $MgAl_2O_4$. The semiconductors can include but not limited to I-V semiconductors or I-V semiconductors, such as Si, Ge, SiC, GaN, AlN, GaP, GaAs, AsGaP, ZnSe, or InP. The carbonaceous materials include but not limited to diamond-like carbon (DLC) or graphene.

The reflective structure 5 includes a first insulating layer 51 and a first conductive oxide layer 52, which is located beneath the first insulating layer 51 and attached to the first insulating layer 51. The first insulating layer 51 is conformally attached to the first protrusion part 111, the platform part 113, and the second protrusion part 112. In this embodiment, the first insulating layer 51 contacts the first base surface S1, the second base surface S2, the third base surface S3, the first side surface S4, and the second side surface S5. In this embodiment, the first insulating layer 51 includes a plurality of openings 511 exposing the contact portions 21. To be more specific, each of the openings 511 can expose the corresponding contact portion 21. Each of the contact portions 21 has an undersurface S6 away from the first type semiconductor structure 11, and a side wall S7 connects to the undersurface S6. The first insulating layer 51 physically contacts the side wall S7 of the contact portion 21. The contact portion 21 has a thickness greater than that of the first insulating layer 51, thus the contact portion 21 protrudes outward the first insulating layer 51 with reference to the third base surface S3. In this embodiment, the thickness of the contact portions 21 is from 0.05 µm to 0.5 µm, such as 0.08 µm, 0.12 µm, 0.15 µm, 0.18 µm, 0.2 µm, 0.22 µm, 0.25 µm, 0.28 µm, 0.3 µm, 0.4 µm, or 0.5 µm. In one embodiment, the contact portion 21 has a thickness less than that of the first insulating layer 51. The thickness of the contact portion 21 can be determined by the peak wavelength of the optoelectronic semiconductor device 100. For example, when the peak wavelength of the optoelectronic semiconductor device 100 is the red light between 610 nm and 700 nm, the thickness of the contact portion 21 can be in the range from 0.2 µm to 0.4 µm; when the peak wavelength of the optoelectronic semiconductor device 100 is the infrared light between 700 nm and 1700 nm, the thickness of the contact portion 21 can be in the range from 0.05 µm to 0.08 µm.

In this embodiment, the reflective structure 5 can additionally include a second conductive oxide layer 53 attached to the first conductive oxide layer 52. The material of the second conductive oxide layer 53 is different from that of the first conductive oxide layer 52. More specifically, in this embodiment, the first conductive oxide layer 52 is indium tin oxide (ITO) and the second conductive oxide layer 53 is indium zinc oxide (IZO). The second conductive oxide layer 53 and the first conductive oxide layer 52 have a difference in the thickness. In one embodiment, the thickness of the first conductive oxide layer 52 is less than that of the second conductive oxide layer 53. In another embodiment, the second conductive oxide layer 53 is discontinuously disposed beneath the first type semiconductor structure 11.

The first conductive oxide layer 52 is conformally attached to the first insulating layer 51 and the contact portions 21 that are uncovered by the openings 511. The first conductive oxide layer 52 contacts the contact portions 21. The first conductive oxide layer 52 is attached to the undersurface S6 and/or the side wall S7 of the contact portion 21. In another embodiment, optionally, the reflective structure 5 does not include the first conductive oxide layer 52 so the second conductive oxide layer 53 is conformally located underneath the first insulating layer 51, the first protrusion part 111, the platform part 113 and the second protrusion part 112. The second conductive oxide layer 53 is indirectly attached to the undersurface S6 and/or a part of the side wall S7 of the contact portion 21.

The reflective structure 5 further includes a metal layer 54 located beneath the second conductive oxide layer 53 and attached to the second conductive oxide layer 53. The metal layer 54 has a first surface 541 away from the second extension electrode 33, the first surface 541 is a flat plane, which means the distance from the first surface 541 to the first base surface S1 along a direction parallel to the Y-axis direction is less than the distance from the first surface 541 to the second base surface S2 along a direction parallel to the Y-axis direction.

In the present disclosure, the optoelectronic semiconductor device 100 additionally includes a bottom electrode 7 located beneath the substrate 4; meanwhile, the upper electrode 3 and the bottom electrode 7 are respectively located on two opposite sides of the semiconductor stack 1 to form a vertical-type optoelectronic semiconductor device 100. The upper electrode 3 and the bottom electrode 7 can include metals or alloys. For example, the metals can include but not limited to Al, Cr, Cu, Sn, Au, Ni, Ti, Pt, Pb, Zn, Cd, Sb, or Co. The alloys can include the material in the abovementioned metals. Besides, the optoelectronic semiconductor device 100 can optionally include a passivation layer 8 attached to the light-emitting surface 141 preventing the external moisture or contaminations entering the semiconductor stack 1 and damaging the optoelectronic property of the optoelectronic semiconductor device 100. For the electrical connection manufacturing steps, the passivation layer 8 can optionally expose the electrode pad 31 and/or the first extension electrodes 32, and the second extension electrodes 33.

The aforementioned first insulating layer 51 includes nonconductive materials, such as organic or inorganic materials. The organic materials include $Su_8$, benzocyclobutene (BCB), perfluorocyclobutyl(PFCB), epoxy, acrylic resin, cyclo olefin copolymer (COC), PMMA, PET, PC, polyetherimide, or fluorocarbon polymer. The inorganic materials include silicon, glass, $Al_2O_3$, $SiN_x$, $SiO_x$, $TiO_x$, or $MgF_x$. In one embodiment, the first insulating layer 51 includes a single layer or multiple layers, for example, a distributed Bragg reflector (DBR) structure which is constituted by two sub-layers stacking alternately. The sub-layers can be $SiO_x$, $TiO_x$, or $MgF_2$.

The first conductive oxide layer 52 and the second conductive oxide layer 53 is transparent to the light emitted from the semiconductor stack 1. Those conductive oxide layers can include metal oxides, such as ITO, InO, SnO, CTO, ATO, AZO, ZTO, GZO, IWO, ZnO, MgO, or IZO.

The metal layer 54 can include metals or alloys, such as Cu, Al, Sn, Au, Ag, Pb, Ti, Ni, Pt, W, or the alloys which include the aforementioned metal materials.

The conductive bonding layer 6 includes conductive materials, such as metal oxides, semiconductors, metals, alloys or carbonaceous materials. For example, the metal oxides can include ITO, InO, SnO, CTO, ATO, AZO, ZTO, GZO, ZnO, indium cerium oxide (ICO), IWO, indium titanium oxide (ITiO), IZO, indium gallium oxide (IGO), or gallium and aluminum codoped zinc oxide (GAZO). The semiconductors can include GaP. The metals can include Cu, Al, Sn, Au, Ag, Pb, Ti, Ni, In, Pt, or W. The alloys can include the aforementioned metal materials. The carbonaceous materials can include graphene. The conductive bonding layer 6 can connect the substrate 4 to the reflective structure 5 and has a plurality of sub-layers (not shown).

Figure 3:
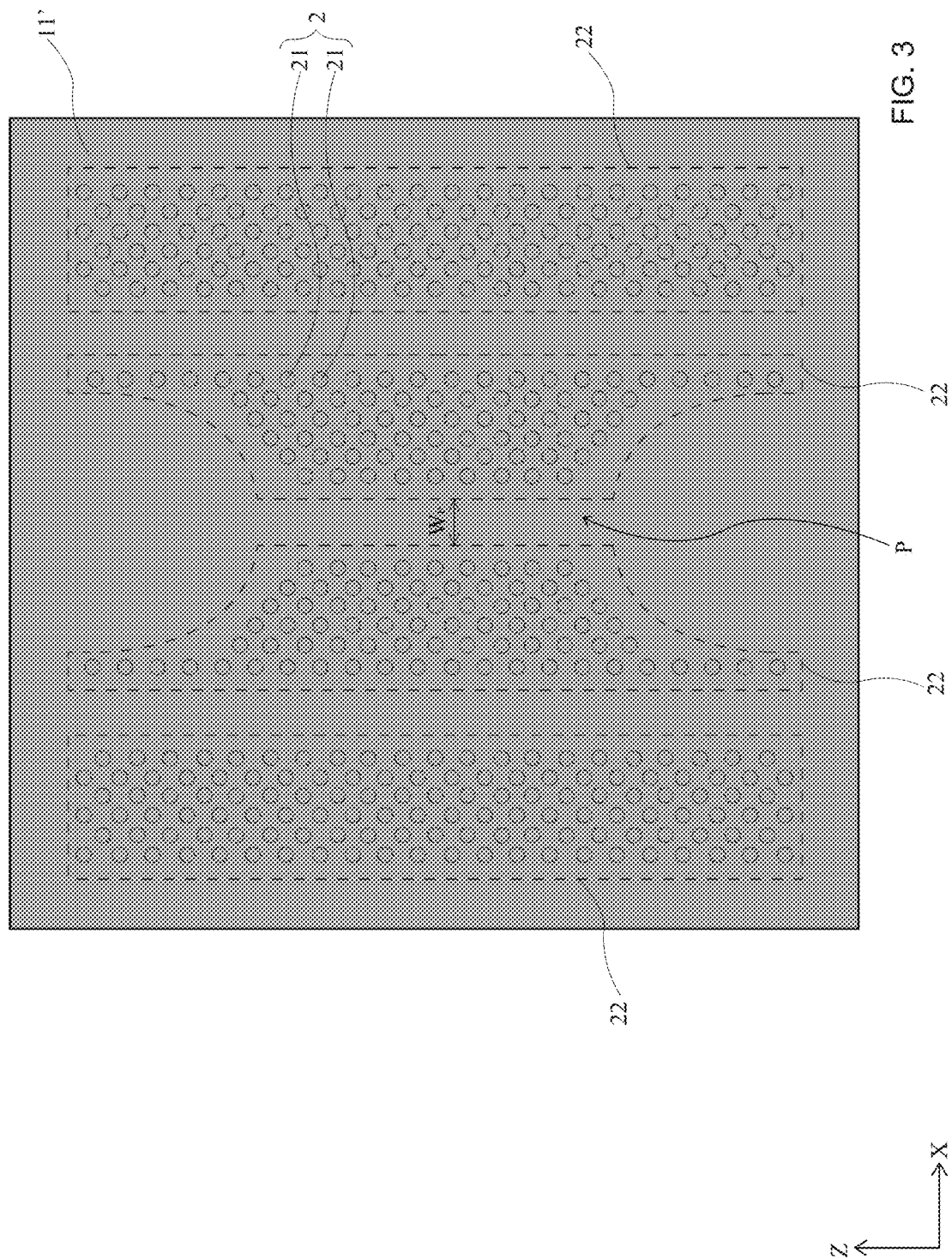
Figure 4:
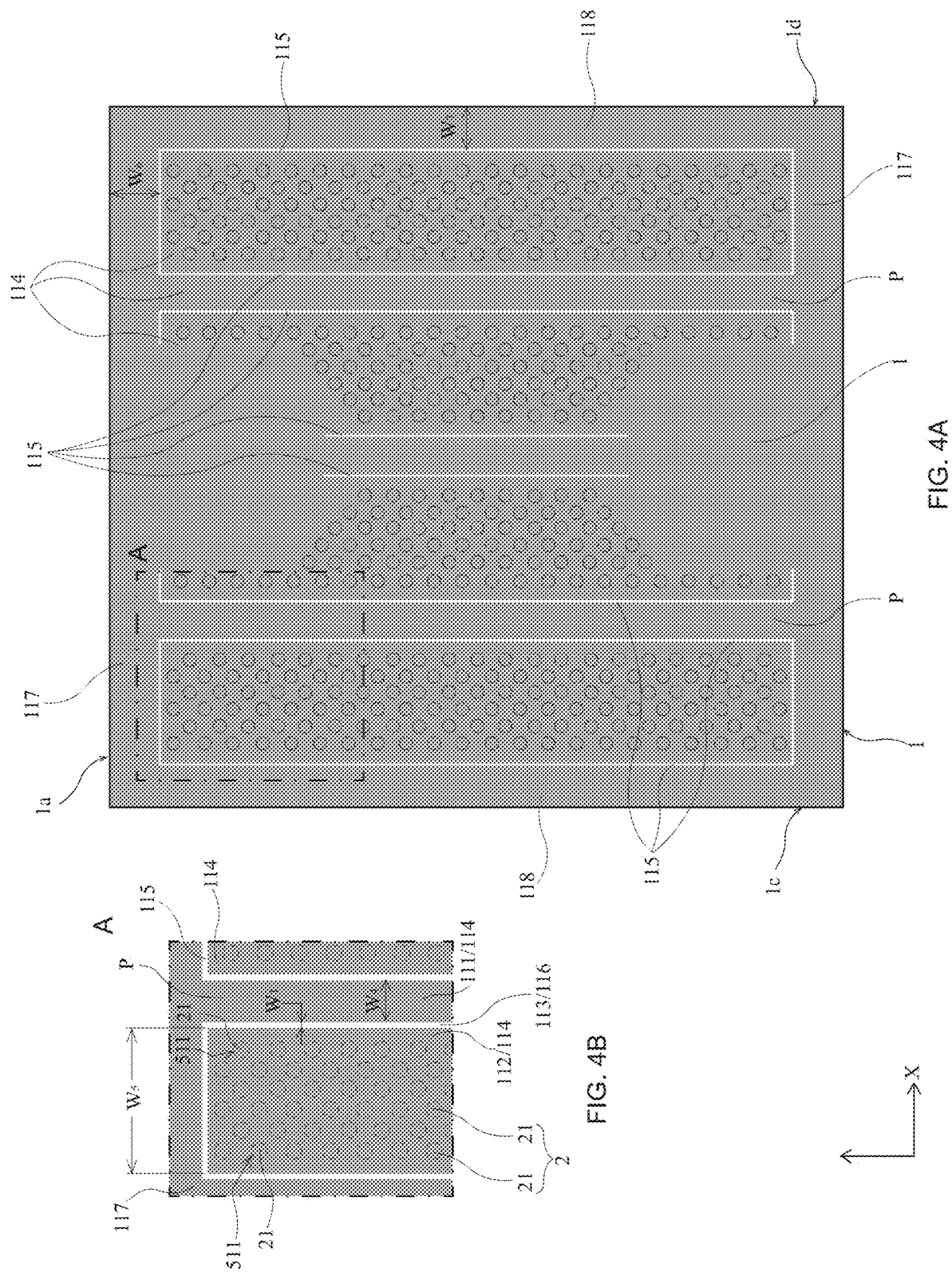

FIG. 3 and FIG. 4A are the bottom view diagrams of two steps of manufacturing the optoelectronic semiconductor device 100 in FIG. 1 as an embodiment in accordance with the present disclosure. FIG. 4B is a partially enlarged view of region A in FIG. 4A. At the beginning of manufacturing the optoelectronic semiconductor device 100, the semiconductor stack 1 and the first contact structures 2 are formed on a growth substrate (not shown) in sequence. As shown in FIG. 3, the first contact structures 2 includes a plurality of contact portion groups 22 separated from each other (the structure included in the rectangle dashed line as shown in FIG. 3), and each of the contact portion groups 22 has the contact portions 21 separated from each other. A path P, corresponding to the location where the second extension electrode 33 is predefined to be formed at, is located between two adjacent contact portion groups 22, and the width Wp of the path P is greater than the third width W3 of the second extension electrode 33. The contact portions 21 of the contact portion groups 22 can have the same or different amount or arrangement. Specifically, the contact portions 21 of one of the contact portion groups 22 has the amount or arrangement same or different from the contact portions 21 of another of the contact portion groups 22. In the embodiment, the contact portions 21 are formed on the semiconductor stack 1 in a two-dimensional arrangement, and the contact portion groups 22 are substantially parallel to each other. The first contact structures 2 can be formed by lithography and etching.

After the step described in FIG. 3, a plurality of recesses 116 can be formed in the first type semiconductor structure 11 by dry etching or wet etching process to define a protrusion structure 114 and a platform structure 115 as shown in FIGS. 4A and 4B. The platform structure 115 includes a plurality of platform parts 113 (as shown in FIG. 1) and the protrusion structure 114 includes a plurality of protrusion parts. Each of the platform parts 113 is located between two adjacent protrusion parts and corresponds to the location of the recess 116. In this embodiment, the protrusion structure 114 includes a plurality of the first protrusion parts 111, a plurality of the second protrusion parts 112, a plurality of the third protrusion parts 117, and a plurality of the fourth protrusion parts 118. The platform structure 115 is located between the first protrusion parts 111 and the second protrusion parts 112, the first protrusion parts 111 corresponds to the location of the path P, and the second protrusion parts 112 are not overlapped with the path P from the top view (along the Y-axis). When viewing from the top, the semiconductor stack 1 has a first edge 1a, a second edge 1b opposite to the first edge 1a, a third edge 1c connecting to the first edge 1a and the second edge 1b, and a fourth edge 1d disposed on the opposite to the third edge 1c. The third protrusion parts 117 are disposed close to the first edge 1a and the second edge 1b, and the first extension electrodes 32 are formed correspondingly on the third protrusion parts 117. The fourth protrusion parts 118 are disposed close to the third edge 1c and the fourth edge 1d. The first protrusion parts 111 and the second protrusion parts 112 are parallel to each other. The third protrusion parts 117 are perpendicular to the fourth protrusion parts 118. The third protrusion parts 117 are connected to the first protrusion parts 111 and the fourth protrusion parts 118.

In this embodiment, when viewing from the top, some platform parts 113 can be a closed shape, e.g., a rectangle, while other platform parts 113 can be an unclosed shape, e.g., a ⊏ shape or a straight line. When the platform part 113 is a closed shape, the platform part 113 surrounds the second protrusion parts 112. The third protrusion parts 117 and the fourth protrusion parts 118 surround the platform parts 113, the first protrusion parts 111, and the second protrusion parts 112.

Referring to FIG. 1 and FIGS. 4A and 4B, the first protrusion part 111 has the fourth width W4, the third base surface S3 of the second protrusion part 112 has the fifth width W5 larger than the fourth width W4. Preferably, the ratio of the fifth width W5 to the fourth width W4 is greater than 2 and less than 15, such as 2.5, 3, 3.25, 3.5, 3.75, 4, 4.5, 5, 7, 9, 11, 13, or 15. The third protrusion part 117 has the sixth width W6 (along the Z-axis direction in the figure) which is in the range between the fourth width W4 and the fifth width W5, and the fourth protrusion part 118 has a seventh width W7 (along the X-axis direction in the figure). In this embodiment, the seventh width W7 is not equal to the sixth width W6, e.g., the seventh width W7 is in the range between the sixth width W6 and the fourth width W4. In some embodiments, the seventh width W7 is equal to the sixth width W6. The platform parts 113 have a first total surface area, i.e., the sum of the second base surface S2 in each of the platform parts 113, the first type semiconductor structure 11 has an upper surface facing the bottom surface S of the active structure 12, and the upper surface has an upper surface area, the first total surface area is 15% to 40% of the upper surface area, such as 15%, 20%, 25%, 30%, 35%, or 40%. The protrusion structure 114 has a second total surface area, i.e., the sum of the bottom surfaces S in the protrusion structure 114 (the area of the first base surface S1+the area of the third base surface S3 . . . ), and the contact portions 21 have a third total surface area which is 15% to 30% of the second total surface area, such as 15%, 18%, 21%, 24%, 27%, or 30%. In the embodiment, as shown in FIG. 1, the first total surface area is 18.6% of the upper surface area and the third total surface area is 17.2% of the second total surface area.

As shown in FIG. 1 and FIGS. 4A and 4B, the first insulating layer 51 is formed with the openings 511, which are located at the second protrusion parts 112 region and expose the contact portions 21, and the width of each of the openings 511 is substantially equal to the width of the corresponding contact portion 21. Because the width of each of the openings 511 is substantially equal to the width of each of the contact portions 21, there is no space between each of the openings 511 and the contact portion 21 therein. Thus, the first conductive oxide layer 52 is attached to every contact portion 21 and the first insulating layer 51, but is not attached to the first type semiconductor structure 11 directly, i.e., the first conductive oxide layer 52 does not contact the third base surface S3 physically.

Following the step shown in FIG. 4A, the first conductive oxide layer 52, the second conductive oxide layer 53, and the metal layer 54 are formed on the surface of the first insulating layer 51 facing toward the substrate 4 in sequence. The optoelectronic semiconductor device 100, as shown in FIG. 1, is formed by connecting the substrate 4 to the metal layer 54 with the conductive bonding layer 6. And the following processes include removing the growth substrate, forming the bottom electrode 7 on the substrate 4, and forming the upper electrode 3 on the window layer 14.

Figure 5:
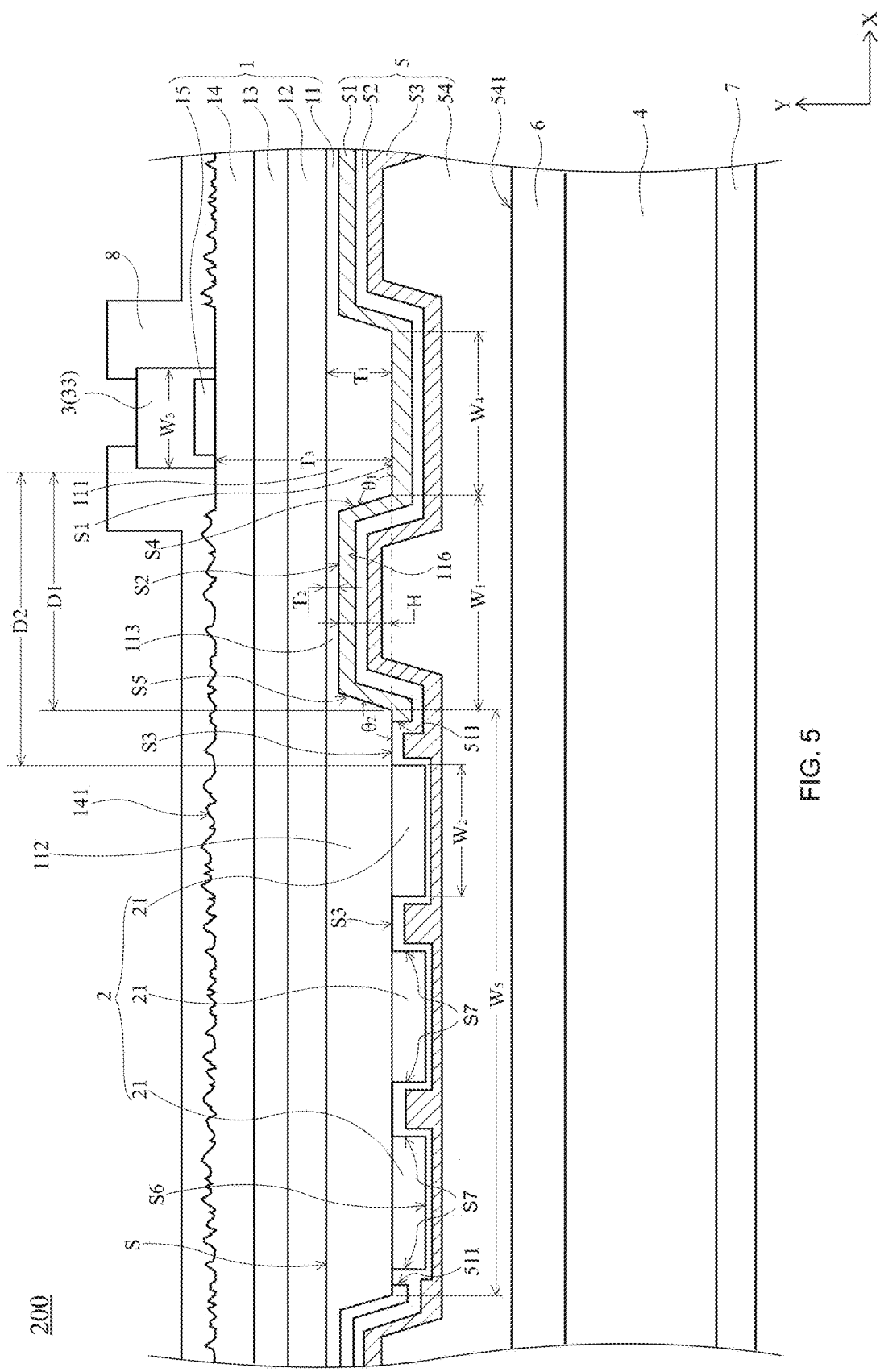
FIG. 5 is a cross-sectional view of the diagram of an optoelectronic semiconductor device disclosed in one embodiment in accordance with the present disclosure.

FIG. 5 is a cross-sectional view of the diagram of the optoelectronic semiconductor device 200 disclosed in an embodiment in accordance with the present disclosure. The configuration and the components of the optoelectronic semiconductor device 200 in this embodiment are similar to those in the optoelectronic semiconductor device 100, and the difference is in the coverage of the first insulating layer 51 in the optoelectronic semiconductor device 200. Specifically, the first insulating layer 51, which includes the openings 511 exposing the contact portions 21 beneath the second protrusion part 112, and the first type semiconductor structure 11 between the contact portions 21 conformally cover the first protrusion part 111, the platform part 113, and a region of the second protrusion part 112. Moreover, the first insulating layer 51 does not directly contact the contact portion 21. The first conductive oxide layer 52 is conformally attached to the first insulating layer 51, the contact portions 21, and the third base surface S3 of the second protrusion part 112. It is that the first conductive oxide layer 52 can contact the third base surface S3 of the second protrusion part 112 physically as the first conductive oxide layer 52 is filled in the regions between the contact portions 21 and the openings 511, or the regions between the contact portions 21 themselves. In one embodiment which does not include the first conductive oxide layer 52, the second conductive oxide layer 53 can be filled in the regions between the contact portions 21 and the openings 511, and the regions between the contact portions 21 themselves, thus the second conductive oxide layer 53 contacts to the third base surface S3 physically.

Figure 6:
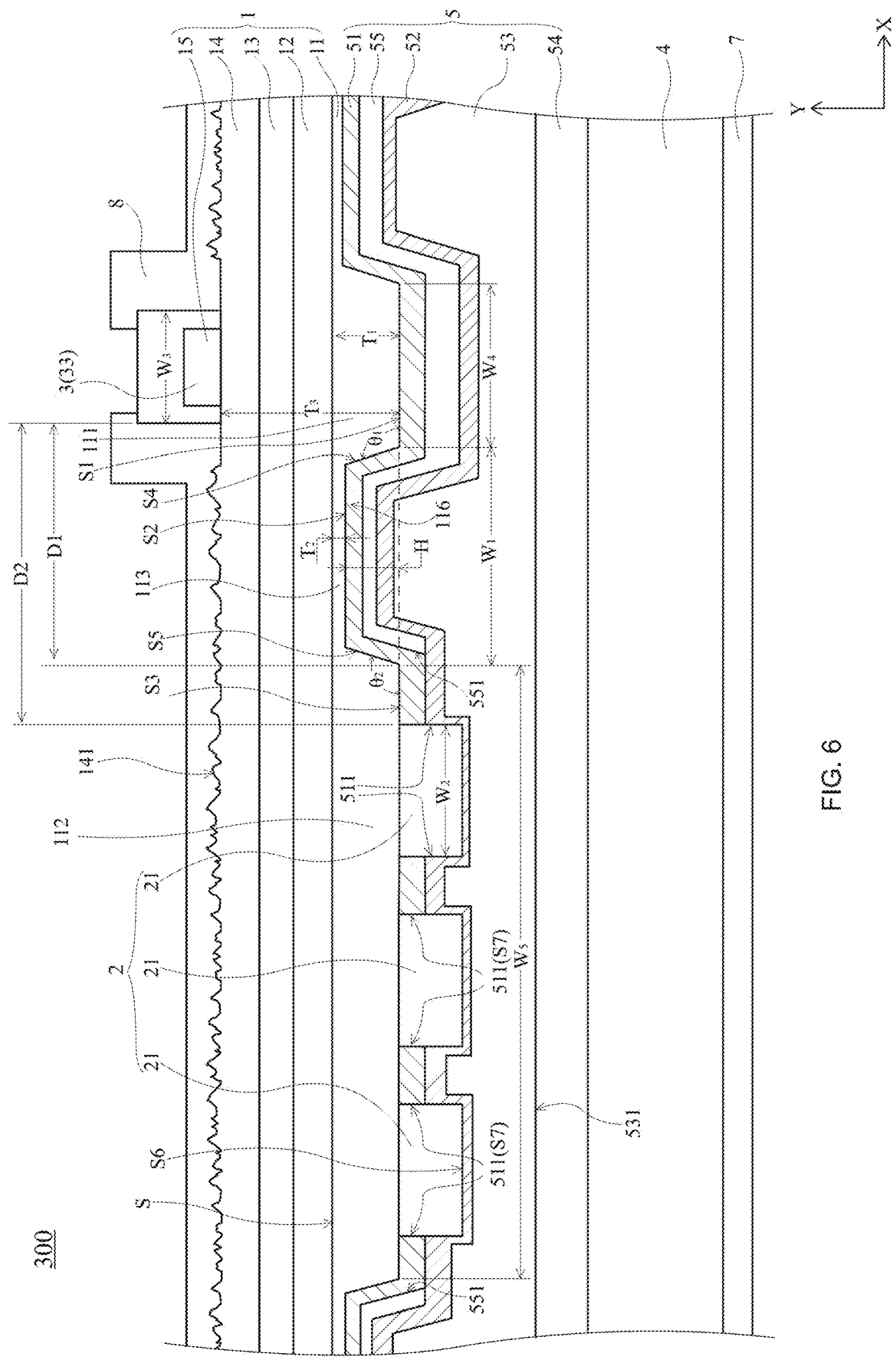
FIG. 6 is a cross-sectional view of the diagram of an optoelectronic semiconductor device disclosed in one embodiment in accordance with the present disclosure.

FIG. 6 is a cross-sectional view of the diagram of an optoelectronic semiconductor device 300 disclosed in one embodiment in accordance with the present disclosure. The configuration and the components of the optoelectronic semiconductor device 300 in this embodiment are similar to those in the optoelectronic semiconductor device 100, and the difference is that the reflective structure 5 of the optoelectronic semiconductor device 300 has a second insulating layer 55 located between the first insulating layer 51 and the first conductive oxide layer 52. When the first side surface S4 and the second side surface S5 is not coated entirely with the first insulating layer 51, attributed to the second insulating layer 55 formed on the first side surface S4 and the second side surface S5, the light emitted from the active structure 12 can be reflected on the interface between the first side surface S4 and the reflective structure 5, and on the interface between the second side surface S5 and the reflective structure 5 to enhance the light extraction efficiency. The material of the second insulating layer 55 can be selected referring to the material of the first insulating layer 51. The material of the second insulating layer 55 and the first insulating layer 51 can be the same or different. In one embodiment, the refraction index of the first insulating layer 51 is less than that of the second insulating layer 55. The refraction index of the first insulating layer 51 can be in the range of 1~1.5, the refraction index of the second insulating layer 55 can be in the range of 1.4~2.2. For example, the first insulating layer 51 can be $MgF_2$ and the second insulating layer 55 can be $SiO_2$. The second insulating layer 55 includes a second opening 551 larger than the openings 511 of the first insulating layer 51, and the second insulating layer 55 is separate to the contact portions 21 without physical contact.

Besides, as shown in FIG. 6, the thickness of the second conductive oxide layer 53 beneath the platform part 113 (i.e., along the Y-axis direction in the figure) is greater than the height H of the recess 116, namely, the second conductive oxide layer 53 has a second surface 531 away from the second extension electrode 33, and the distance from the second surface 531 to the first base surface S1 along a direction parallel to the Y-axis direction is less than the distance from the second surface 531 to the second base surface S2 along a direction parallel to the Y-axis direction.

The second conductive oxide layer 53 connects to the metal layer 54 with the second surface 531 in order to improve the process reliability of forming the metal layer 54 in the following steps.

Figure 7A:
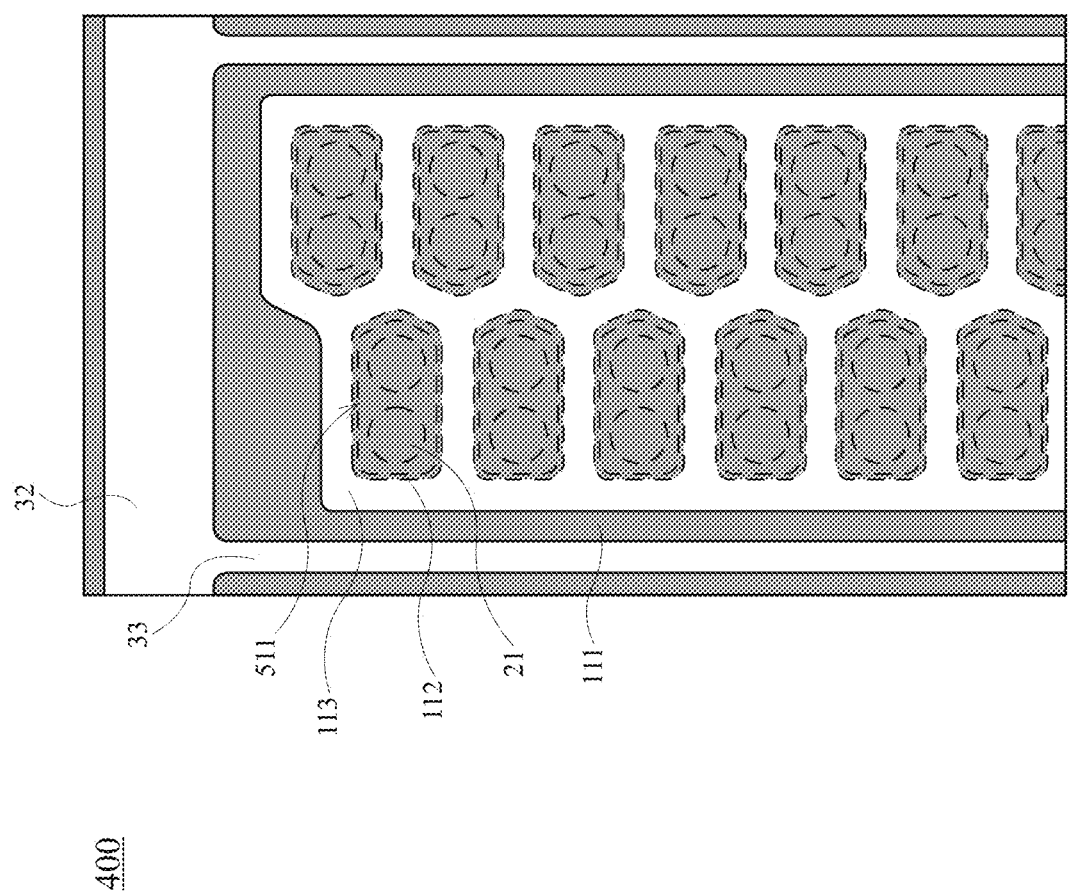
FIG. 7A is a top view of an optoelectronic semiconductor device disclosed in one embodiment in accordance with the present disclosure.
Figure 7B:
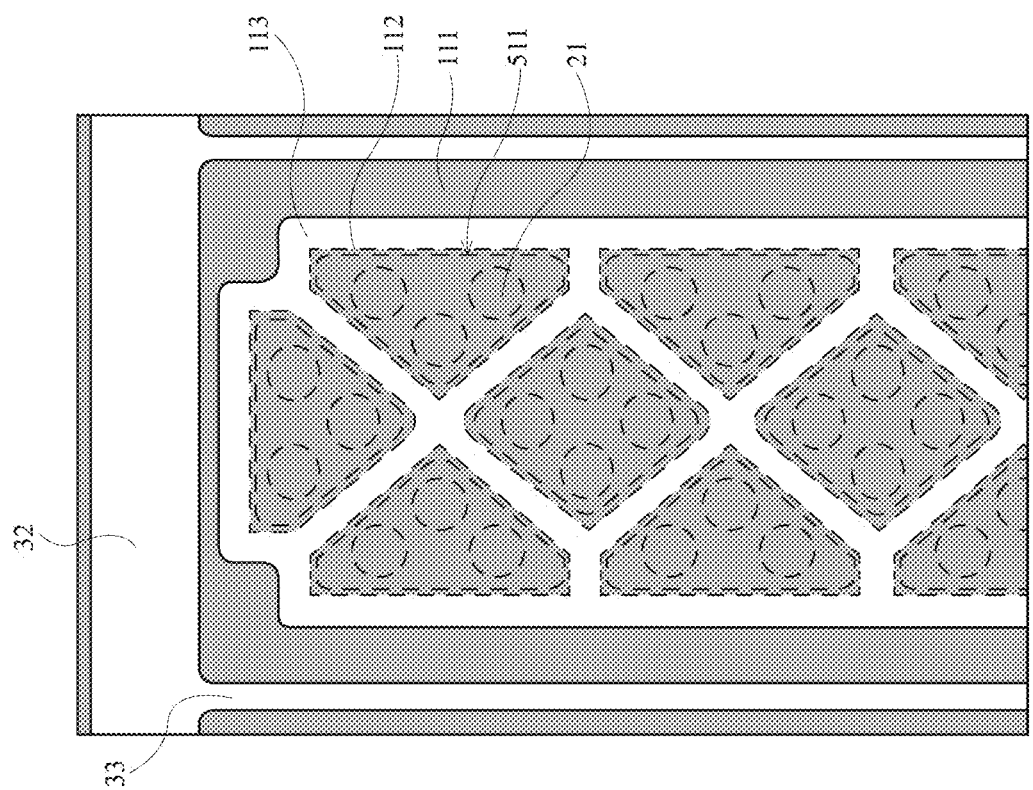
FIG. 7B is a top view of an optoelectronic semiconductor device disclosed in one embodiment in accordance with the present disclosure.

FIG. 7A and FIG. 7B are top view diagrams of the optoelectronic semiconductor device 400 and the optoelectronic semiconductor device 500 in one embodiment in accordance with the present disclosure. For explicit statements, FIG. 7A and FIG. 7B show the relative position and scope of some components of the optoelectronic semiconductor device 400 and the optoelectronic semiconductor device 500; however, some structures of the components cannot be directly observed from the top view by naked eyes or microscopes. The configuration and the components of the optoelectronic semiconductor device 400 in this embodiment are similar to the optoelectronic semiconductor device 100 as shown in FIG. 1. The difference is in the distribution of the first protrusion parts 111, the second protrusion parts 112, the platform part 113, and the shape of the openings 511 in the optoelectronic semiconductor device 400. In this embodiment, the first type semiconductor structure 11 has plural second protrusion parts 112 separated to each other, and the platform part 113 surrounds the second protrusion parts 112. Besides, the first insulating layer 51 has the openings 511 different from the openings 511 of the optoelectronic semiconductor device 100. It is that each of the openings 511 of the optoelectronic semiconductor device 100 exposes one contact portion 21 only. In this embodiment, each of the openings 511 exposes plural contact portions 21. The openings 511 and the second protrusion parts 112 are pentagons. Moreover, the first total surface area in this embodiment is 38.9% of the upper surface area and the third total surface area is 22.3% of the second total surface area.

The configuration and the components of the optoelectronic semiconductor device 500 in FIG. 7B are similar to the optoelectronic semiconductor device 400 as shown in the FIG. 7A. The difference is in the distribution of the first protrusion parts 111, the second protrusion parts 112 and the platform part 113, and the shape of the openings 511 in the optoelectronic semiconductor device 500. In this embodiment, the first type semiconductor structure 11 includes the separate second protrusion parts 112 with different shapes, such as triangle-like or rhombus-like, and the platform part 113 surrounds the second protrusion parts 112. In addition, the first insulating layer 51 has the openings 511, and each of the openings 511 exposes plural contact portions 21. The openings 511 and the second protrusion parts 112 can be a triangle-like or rhombus-like shape. Moreover, the first total surface area is 32.7% of the upper surface area and the third total surface area is 25.8% of the second total surface area.

Figures 8, 9:
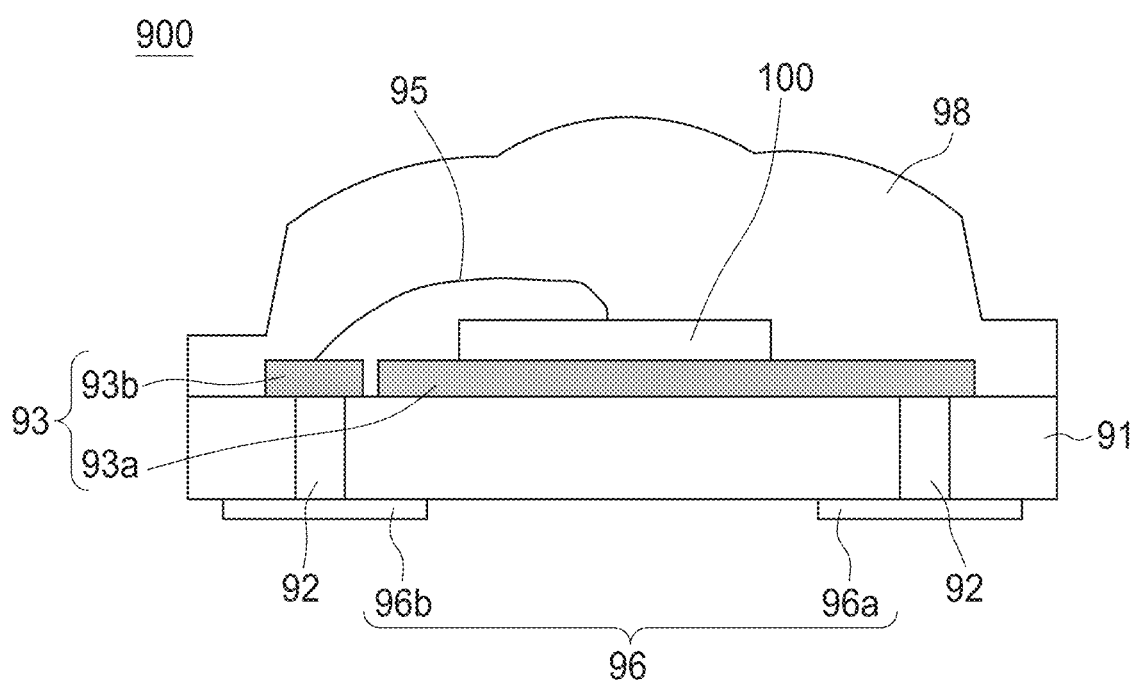
FIG. 8 is a radiant flux comparison table of different embodiments in accordance with the present disclosure.
FIG. 9 is a diagram of a package structure of an optoelectronic semiconductor device in one embodiment in accordance with the present disclosure.

FIG. 8 is a radiant flux comparison table between the comparison sample and the experimental samples of embodiments in accordance with the present disclosure. The experimental 1 represents the optoelectronic semiconductor device 100 in FIG. 1, the experimental 2 represents the optoelectronic semiconductor device 400 in FIG. 7A, the experimental 3 represents the optoelectronic semiconductor device 500 in FIG. 7B. The comparison sample represents an optoelectronic semiconductor whose first type semiconductor structure does not include the protrusion structure and the platform part. In other words, the first type semiconductor structure of the comparison sample does not include the recess, and thus the surface of the first type semiconductor structure away from the upper electrode is a flat plane. From FIG. 8, the optoelectronic semiconductors in experimental samples 1 to 3 have greater radiant flux than that of the comparison sample. In addition, there are luminous intensity enhancement ratios of experimental samples 1 to 3 ranging from 1.53% to 5.7% comparing with the comparison sample. The calculation of the radiant flux enhancement ratio is shown in the following: defining the radiant flux of the optoelectronic semiconductor in the comparison sample as P0; defining the radiant flux of the optoelectronic semiconductor in the experimental 1 as P1; calculating the radiant flux enhancement ratio by [(P1−P0)/P0]×100%.

FIG. 9 is a diagram of a package structure 900 of the optoelectronic semiconductor in one embodiment in accordance with the present disclosure. The package structure 900 includes an optoelectronic semiconductor device 100, a packaging mount 91, a carrier 93, a bonding wire 95, an electrical connection structure 96, and an encapsulating structure 98. The packaging mount 91 can include ceramic or glass. The packaging mount 91 has multiple channels 92, which can be filled with electrically conductive material such as metal for facilitating electrical conduction or/and heat dissipation. The carrier 93 is located on the surface of one side of the packaging mount 91 and can include an electrically conductive material such as metal. The electrical connection structure 96 is located on the surface of another side of the packaging mount 91. In this embodiment, the electrical connection structure 96 includes a first contact pad 96a and a second contact pad 96b. The first contact pad 96a and the second contact pad 96b. can connect to the carrier 93 electrically through the channels 92. In one embodiment, the electrical connection structure 96 can additionally include a thermal pad (not shown) located, for example, between the first contact pad 96a and the second contact pad 96b. The optoelectronic semiconductor device 100 is located on the carrier 93 and can be applied to any of the embodiments in the present disclosure. In this embodiment, the carrier 93 includes the first part 93a and the second part 93b, and the optoelectronic semiconductor device 100 can electrically connect to the second part 93b of the carrier 93 by the bonding wire 95. The bonding wire 95 can include metal, such as Au, Ag, Cu, Al, or the alloy including one of the aforementioned metals. The encapsulating structure 98 can protect the optoelectronic semiconductor device 100 by covering the optoelectronic semiconductor device 100. More specifically, the encapsulating structure 98 can include resin, such as epoxy, silicone. The encapsulating structure 98 can additionally include a plurality of wavelength conversion particles (not shown) to convert a first light emitted from the optoelectronic semiconductor device 100 into a second light. The second light has a wavelength longer than that of the first light. In some embodiments, the optoelectronic semiconductor device 100 in the above-mentioned package structure 900 can be replaced by optoelectronic semiconductor device 200, 300, 400, or 500. Furthermore, in some embodiments, the package structure 900 can include multiple optoelectronic semiconductor devices 100, 200, 300, 400 and/or 500. In addition, those optoelectronic semiconductor devices 100, 200, 300, 400 and/or 500 can be connected in series, in parallel or in the combination of aforementioned connections. The abovementioned optoelectronic semiconductor device 100, 200, 300, 400, 500, or the package structure 900 can be applied to the fields of the light-emitting devices, especially for automobile or plant, backlight modules, display modules, etc.

The embodiments of the present disclosure will be described in detail below with reference to the drawings. In the descriptions of the specification, specific details are provided for a full understanding of the present disclosure. The same or similar components in the drawings will be denoted by the same or similar symbols. It is noted that the drawings are for illustrative purposes only and do not represent the actual dimensions or quantities of the components. Some of the details may not be fully sketched for the conciseness of the drawings.

What is claimed is:

1. An optoelectronic semiconductor device, comprising:
a semiconductor stack having a thickness and comprising a first type semiconductor structure, wherein the first type semiconductor structure comprising a protrusion structure, the protrusion structure comprising a first protrusion part and a second protrusion part;
an electrode on the first type semiconductor structure, and having a region corresponding to the first protrusion part; and
a contact structure comprising a plurality of contact portions and located at the second protrusion part without overlapping with the first protrusion part,
wherein a first distance is between the electrode and the nearest contact portion and a ratio of the first distance to the thickness of the semiconductor stack is greater than 5.

2. The optoelectronic semiconductor device according to claim 1, further comprising an insulating layer having a plurality of openings on the second protrusion part.

3. The optoelectronic semiconductor device according to claim 2, wherein the contact structure is located at the openings.

4. The optoelectronic semiconductor device according to claim 1, further comprising a recess formed in the first type semiconductor structure wherein the recess has a width and a height, and a ratio of the width of the recess to the height of the recess is greater than 3 and less than 8.

5. The optoelectronic semiconductor device according to claim 1, wherein the first type semiconductor structure further comprises a plurality of platform parts having a first total surface area in a top view, and the first type semiconductor structure has an upper surface facing the active structure wherein the first total surface area is 15% to 40% of the area of the upper surface.

6. The optoelectronic semiconductor device according to claim 1, wherein the protrusion structure has a second total surface area, and the contact structure has a third total surface area in a top view, the third total surface area is 15%~30% of the second total surface area.

7. The optoelectronic semiconductor device according to claim 1, further comprising a second distance between the electrode and the second protrusion part, and the second distance is less than the first distance.

8. The optoelectronic semiconductor device according to claim 7, wherein the difference between the first distance and the second distance is less than 20 µm and greater than 2 µm.

9. The optoelectronic semiconductor device according to claim 1, wherein the contact portions include III-V compound semiconductor.

10. The optoelectronic semiconductor device according to claim 2, wherein the contact structure has a first thickness and the insulating layer has a second thickness less than the first thickness.

11. The optoelectronic semiconductor device according to claim 1, wherein the first type semiconductor structure further comprises a platform part, the first protrusion part has a third thickness, the platform part has a fourth thickness, and a ratio of the third thickness to the fourth thickness ranges between 2 and 20.

12. The optoelectronic semiconductor device according to claim 11, wherein the third thickness is in the range between 0.5 µm and 2 µm, and the fourth thickness is in the range between 0.01 µm and 1 µm.

13. An optoelectronic semiconductor device, comprising:
a substrate;
a first type semiconductor structure on the substrate and comprising a first protrusion part and a second protrusion part;
an electrode on the first type semiconductor structure; and
a contact structure comprising a plurality of contact portions and located between the substrate and the first type semiconductor structure;
wherein a first distance is between the electrode and the nearest contact portion, and a second distance is between the electrode and the second protrusion part, and the difference between the first distance and the second distance is less than 20 µm and greater than 2 µm.

14. The optoelectronic semiconductor device according to claim 13, further comprising an insulating layer attached to the first type semiconductor structure.

15. The optoelectronic semiconductor device according to claim 14, wherein an opening formed in the insulating layer and located at the second protrusion part.

16. The optoelectronic semiconductor device according to claim 15, wherein there is no opening formed in the insulating layer, and no opening located at the first protrusion part.

17. The optoelectronic semiconductor device according to claim 13, further comprising a conductive oxide layer located on the second protrusion part.

18. The optoelectronic semiconductor device according to claim 14, wherein the contact structure has a side wall, and the insulating layer is attached to the side wall.

19. The optoelectronic semiconductor device according to claim 13, further comprising a recess in the first type semiconductor structure.

20. A package structure comprising:
a package mount;
an optoelectronic semiconductor device of claim 13 on the package mount; and
an encapsulating structure covering the optoelectronic semiconductor device.

* * * * *